(12) United States Patent
Kobayashi et al.

(10) Patent No.: US 11,446,751 B2
(45) Date of Patent: Sep. 20, 2022

(54) SOLDERING SYSTEM INCLUDING TEMPERATURE DISTRIBUTION MEASUREMENT CONTROL DEVICE, CONTROL METHOD, AND PROGRAM

(71) Applicant: Mitsubishi Electric Corporation, Tokyo (JP)

(72) Inventors: Takashi Kobayashi, Tokyo (JP); Masayoshi Tamura, Tokyo (JP); Nobuyasu Kitagawa, Tokyo (JP); Tsuyoshi Tanabe, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 570 days.

(21) Appl. No.: 16/476,431

(22) PCT Filed: Jan. 26, 2018

(86) PCT No.: PCT/JP2018/002414
§ 371 (c)(1),
(2) Date: Jul. 8, 2019

(87) PCT Pub. No.: WO2018/139571
PCT Pub. Date: Aug. 2, 2018

(65) Prior Publication Data
US 2019/0375036 A1 Dec. 12, 2019

(30) Foreign Application Priority Data
Jan. 30, 2017 (JP) .............................. JP2017-014508

(51) Int. Cl.
*B23K 1/002* (2006.01)
*B23K 3/06* (2006.01)

(52) U.S. Cl.
CPC ............ *B23K 1/002* (2013.01); *B23K 3/0653* (2013.01)

(58) Field of Classification Search
CPC .. B23K 1/002; B23K 3/0653; B23K 2101/42; B23K 1/0016; B23K 1/00; B23K 1/08; B23K 1/085; B23K 3/08; H05K 3/34
See application file for complete search history.

(56) References Cited

U.S. PATENT DOCUMENTS 4,775,776 A * 10/1988 Rahn .................... H05K 3/3494
228/9
2002/0036223 A1 3/2002 Saito

FOREIGN PATENT DOCUMENTS

DE 3752133 T2 3/1998
JP H01302149 A 12/1989
(Continued)

OTHER PUBLICATIONS

Rejection Decision dated Jun. 18, 2021, issued in corresponding Chinese Patent Application No. 201880007049.6, 31 pages including 24 pages of English translation.
(Continued)

*Primary Examiner* — John P. Dulka
(74) *Attorney, Agent, or Firm* — Buchanan Ingersoll & Rooney PC

(57) ABSTRACT

A soldering system includes a temperature measurement device that measures a temperature distribution of a surface of a substrate. The soldering system also includes a driver that drives the soldering system based on a control parameter obtained from the temperature distribution measured by the temperature measurement device.

13 Claims, 11 Drawing Sheets

(56) References Cited

FOREIGN PATENT DOCUMENTS

| JP | H0483152 A | 3/1992 |
| JP | H10193092 A | 7/1998 |
| JP | 2002172459 A | 6/2002 |
| JP | 2006140244 A | 6/2006 |

OTHER PUBLICATIONS

Office Action dated Dec. 10, 2019, issued in corresponding Japanese Patent Application No. 2018-564645, 6 pages including 3 pages of English translation.
Office Action dated Nov. 20, 2020, issued in Chinese Patent Application No. 201880007049.6, 31 pages including 20 pages of English translation.
Office Action dated Aug. 25, 2021, in corresponding German Patent Application No. 112018000593.3 and English translation of the Office Action (11 pages).
International Search Report (PCT/ISA/210) dated Mar. 27, 2018, by the Japan Patent Office as the International Searching Authority for International Application No. PCT/JP2018/002414.
Written Opinion (PCT/ISA/237) dated Mar. 27, 2018, by the Japan Patent Office as the International Searching Authority for International Application No. PCT/JP2018/002414.

* cited by examiner

US 11,446,751 B2

SOLDERING SYSTEM INCLUDING TEMPERATURE DISTRIBUTION MEASUREMENT CONTROL DEVICE, CONTROL METHOD, AND PROGRAM

TECHNICAL FIELD

The present disclosure relates to a soldering system, a control apparatus, a control method, and a program.

BACKGROUND ART

A soldering system solders a component to a substrate, which is being conveyed, by blowing molten solder located inside a solder bath upwards onto the substrate via a former that is located beneath the substrate. When the soldering system is operated for a long period of time, oxidized lumps accumulate in the solder bath. The location of the oxidized lumps in the solder bath changes from moment to moment due to convection. When the accumulated oxidized lumps flow into the former or near the former, the amount of jet solder that is blown from the former becomes uneven. When the amount of jet solder blown out is uneven, this can result in defective soldering of the component. Also, when the amount of the jet solder blown out is uneven, the amount of heat applied to the substrate by the jet solder varies by location. This heated amount variance is the cause of defective soldering. The oxidized lumps in the solder bath are also known as dross.

CITATION LIST

Patent Literature

Patent Literature 1 discloses a soldering device that can adjust a location of the former by observation of a soldering result.

SUMMARY OF INVENTION

Patent Literature 1: Unexamined Japanese Patent Application Kokai Publication No. 2002-172459

Technical Problem

With the soldering device of Patent Literature 1, a worker observes, via a monitor screen, a surface of the substrate to which soldering is performed. The worker adjusts the location of the former based on an observation result. Therefore, with the soldering device of Patent Literature 1, judgment by an experienced worker is necessary in order to appropriately adjust the location of the former. Also, in order to perform soldering appropriately, a temperature of the solder, flow amount of the solder, and the like are preferably adjusted. With the soldering device of Patent Literature 1, only the location of the former is adjusted. Patent Literature 1 does not disclose about adjusting the temperature of the solder, the flow of the solder, and the like.

In consideration of the above problem, an objective of the present disclosure is to provide a soldering system, a control apparatus, a control method, and a program that enable more appropriate soldering.

Solution to Problem

In order to achieve the above objective, a soldering system of the present disclosure, for soldering a solder workpiece by jetting molten solder stored in a solder bath, includes temperature measurement means and driving means. The temperature measurement means measures a temperature distribution of a surface of the solder workpiece. The driving means drives the soldering system based on a control parameter obtained from the temperature distribution measured by the temperature measurement means.

Advantageous Effects of Invention

According to the present disclosure, the soldering system includes the temperature measurement means for measuring the temperature distribution of the surface of the solder workpiece and the driving means for driving the soldering system based on the control parameter obtained from the temperature distribution measured by the temperature measurement means. With this configuration, the control parameter of the soldering system can be easily adjusted, and soldering can be performed more appropriately.

DESCRIPTION OF EMBODIMENTS

Figure 1:
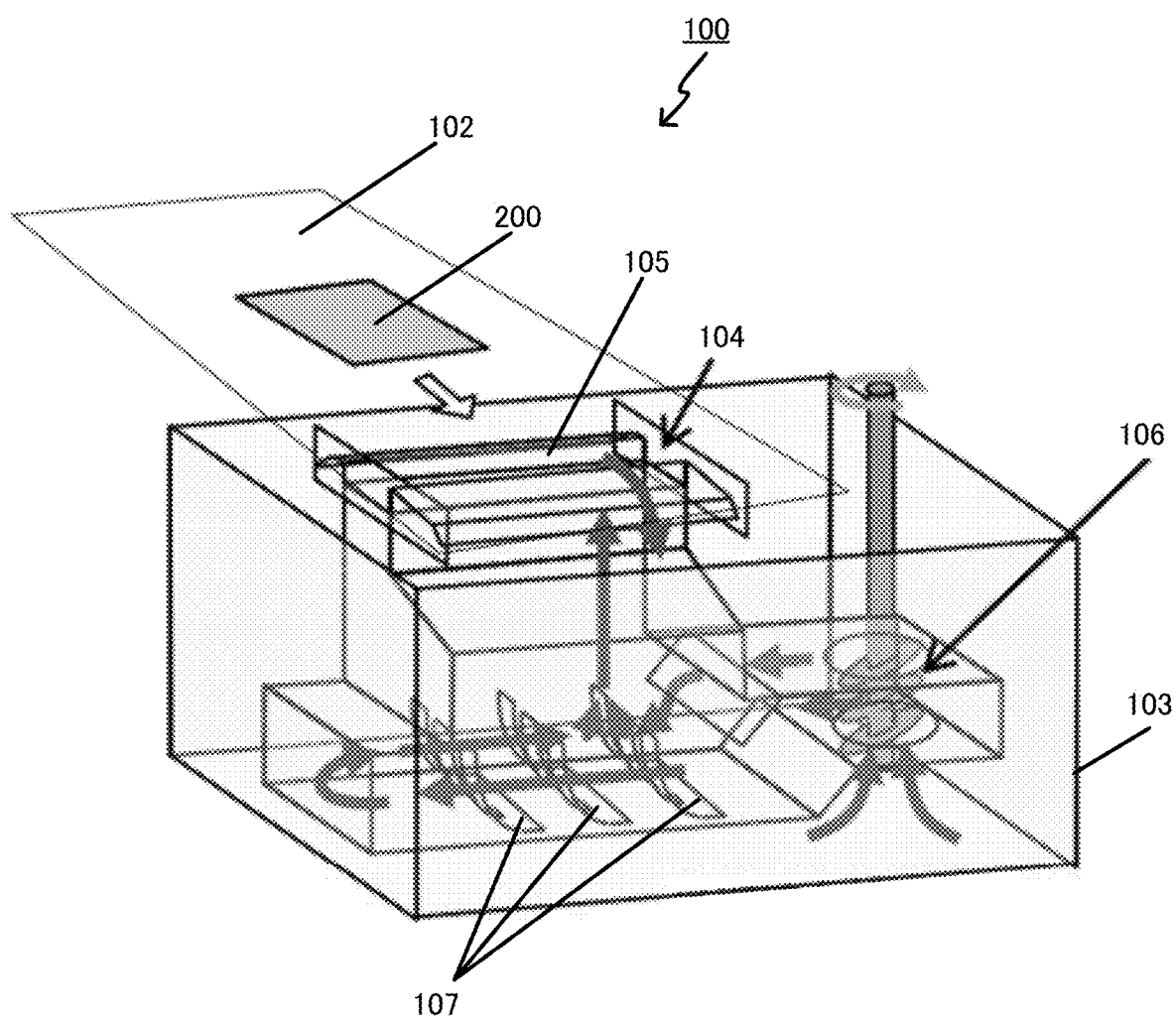
FIG. 1 is a schematic diagram of a soldering system according to Embodiment 1.

A soldering system according to the embodiments of the present disclosure identifies whether or not a temperature distribution of a surface of a substrate that is solder workpiece is within an allowable range. When the temperature distribution is identified as being outside of the allowable range, the soldering system according to the embodiments obtains a control parameter to place the temperature distribution within the allowable range. The soldering system according to the embodiments performs soldering appropriately based on the obtained control parameter. The term "control parameter" is a parameter that determines a soldering condition. Examples of the control parameter, which is described further below, include an angle of a former 104, and angle of a multi-hole nozzle plate 108, a conveyance speed of a substrate conveyance belt device 102, a temperature of molten solder inside a solder bath 103, a jet flow amount of the molten solder, a jet flow location of the molten solder, a jet flow angle of the molten solder, and a rotational speed of a pump 106.

Hereinafter, the soldering system according to the embodiments of the present disclosure is described with reference to the drawings.

Embodiment 1

A schematic diagram of a soldering system 100 according to Embodiment 1 is illustrated in FIG. 1. As illustrated in FIG. 1, a substrate 200, which is a solder workpiece, is conveyed by a substrate conveyance belt device 102 to the upper portion of a solder bath 103. The bottom surface of the substrate 200 has a non-illustrated circuit pattern. Also, the substrate 200 has non-illustrated through-holes. Although not illustrated, the terminal of a non-illustrated electronic component is inserted into one of the through-holes of the substrate 200. The soldering system 100 solders the terminal of the electronic component to the circuit pattern of the substrate 200.

Molten solder is stored in the solder bath 103. Also, a former 104, a pump 106, and solder guide plates 107 are provided inside the solder bath 103. The molten solder inside the solder bath 103 is guided by the pump 106 and the solder guide plates 107 to the former 104. The molten solder guided to the former 104 is blown from the former 104 upwards toward the substrate 200 as jet solder. In doing so, the substrate 200 is soldered.

The movement of the molten solder inside the solder bath 103 is described with reference to FIG. 2. The pump 106 sucks-in the molten solder that is inside the solder bath 103, and then discharges the sucked-in molten solder in the direction of the solder guide plates 107. The jet amount of the discharged molten solder is adjusted by the rotational speed of the pump 106. The solder guide plates 107 causes the molten solder discharged from the pump 106 to flow to a nozzle 105 formed by a front former 104a and a rear former 104b. Then the molten solder is blown upwards from the nozzle 105 toward the substrate 200 as jet solder. In doing so, the terminal of the electronic component 201 is soldered to the circuit pattern of the substrate 200.

Figure 3:
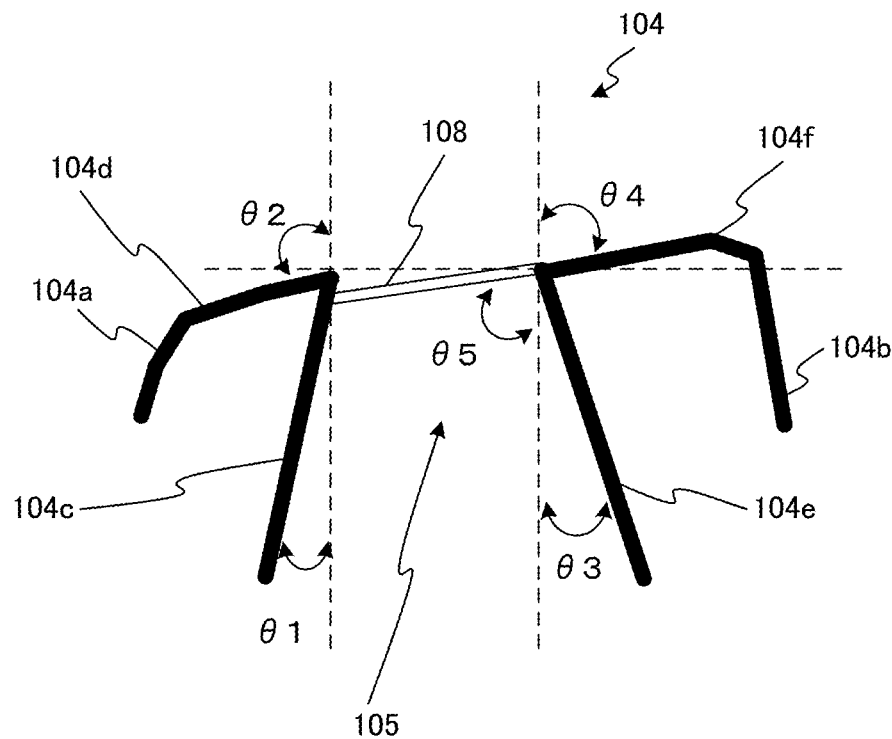
FIG. 3 is a schematic diagram illustrating a former according to Embodiment 1.

A configuration of the former 104 is described with reference to FIG. 3. FIG. 3 illustrates a cross-section of the former 104 taken along a conveyance direction of the substrate 200. As illustrated in FIG. 3, the former 104 includes the front former 104a and the rear former 104b. With respect to the conveyance direction of the substrate 200, the front former 104a is disposed in the foreground and the rear former 104b is disposed in the background.

The front former 104a includes a nozzle wall 104c and an extended wall 104d that bends from the nozzle wall 104c extending rearwardly. The nozzle wall 104c guides the molten solder upwards. The extended wall 104d guides spouted jet solder rearwards while supporting the jet solder. The front former 104a is vertically disposed with the nozzle wall 104c tilted with respect to the vertical direction. Also, the rear former 104b includes a nozzle wall 104e and an extended wall 104f that bends from the nozzle wall 104e extending forwardly. The nozzle wall 104e guides the spouted jet solder upwards. The extended wall 104f guides the spouted jet solder forwards while supporting the jet solder. The rear former 104b is vertically disposed with the nozzle wall 104e tilted with respect to the vertical direction. The nozzle wall 104c and the nozzle wall 104e together form the nozzle 105 from which the molten solder is blown upwards.

Angle θ1 of the nozzle wall 104c of the front former 104a with respect to the vertical line, angle θ2 of the extended wall 104d of the front former 104a with respect to the vertical line, angle θ3 of the nozzle wall 104e of the rear former 104b with respect to the vertical line, and angle θ4 of the extended wall 104f of the rear former 104b with respect to the vertical line, change independent of one another by the control from the control apparatus 1 described further below. Increasing angles θ1 and θ3, increases the spouting speed of the jet solder, thereby increasing the height to which jet solder can be blown upwards. Increasing angles θ2 and θ4 shortens the time the jet solder contacts with the substrate 200.

Figure 4:
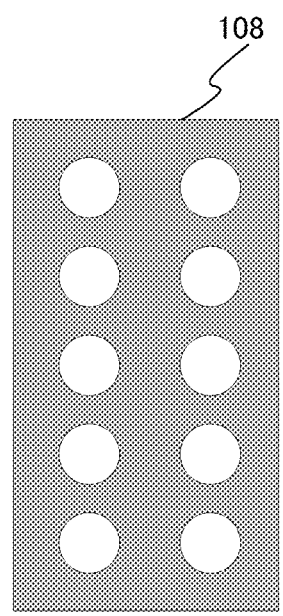
FIG. 4 is a schematic diagram illustrating a multi-hole nozzle plate according to Embodiment 1.

Also, a multi-hole nozzle plate 108 is disposed at the outlet of the nozzle 105. The multi-hole nozzle plate 108 is a flat plate. The multi-hole nozzle plate 108 has round holes as illustrated in FIG. 4. The jet solder is spouted from the round holes of the multi-hole nozzle plate 108. Since the multi-hole nozzle plate 108 is disposed at the nozzle 105, the spouting speed of the jet solder can be increased. Also, as illustrated in FIG. 3, angle θ5 of the multi-hole nozzle plate 108 with respect to the vertical line can be modified by control from the control apparatus 1. The jet flow angle of the jet solder can be adjusted by changing angle θ5.

The soldering system 100 can also modify the conveyance speed of the substrate conveyance belt device 102, the temperature of the molten solder inside the solder bath 103, the rotational speed of the pump 106, and the like by control from the control apparatus 1.

Figure 2:
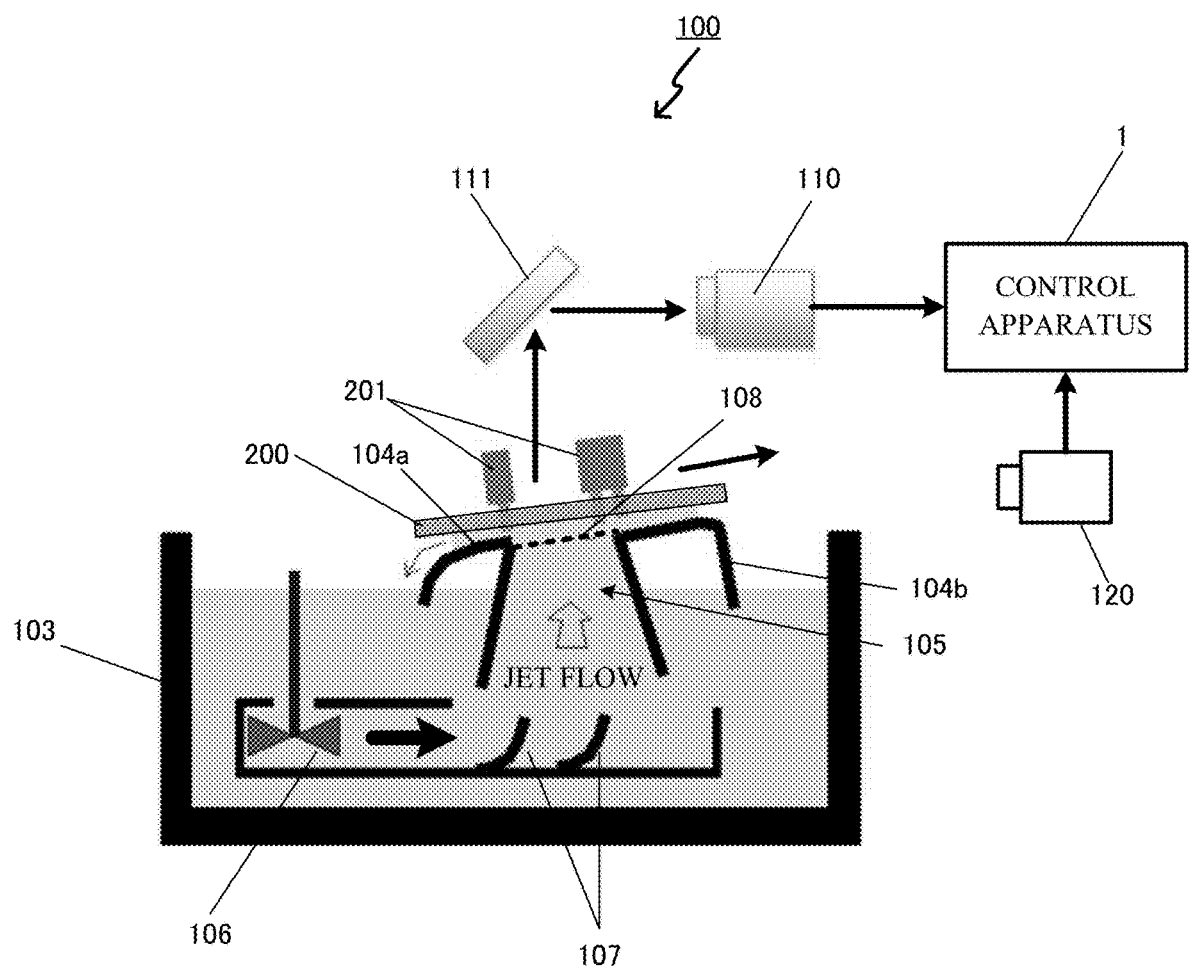
FIG. 2 is a schematic diagram illustrating a flow of molten solder in the soldering system according to Embodiment 1.

The soldering system 100, as illustrated in FIG. 2, further includes a reflective mirror 111 that is disposed above the former 104, and a temperature measurement device 110 that measures a surface temperature of the substrate 200. Furthermore, the soldering system 100 includes an image-capturing device 120 that takes images of a state of solder on the soldered substrate 200, and a control apparatus 1 that controls each component of the soldering system 100. The reflective mirror 111 is an aluminum vapor deposited infrared mirror. The reflective mirror 111 is installed directly above the vicinity of the solder bath 103. The reflective mirror 111 reflects infrared rays emitted from the surface of the substrate 200 onto which the jet solder is blown.

The temperature measurement device 110 functions as the temperature measurement means. The temperature measurement device 110 includes an infrared camera. The temperature measurement device 110 uses the infrared camera to take an image, via the reflective mirror 111, of the surface of the substrate 200 onto which the jet solder is blown. The temperature measurement device 110 measures a distribution of the surface temperature of the substrate 200 based on an infrared image taken by the infrared camera. The temperature measurement device 110 outputs measured temperature information of the surface of the substrate 200 to the control apparatus 1.

The image-capturing device 120 includes a charge coupled device (CCD) camera, complementary metal-oxide-semiconductor (CMOS) sensor, and the like. The image-capturing device 120 captures an image of the bottom surface of the substrate 200 that is conveyed to a location away from the solder bath 103, and outputs captured image data of the bottom surface of the substrate 200 to the control apparatus 1. In order to evaluate the state of the soldering, the image-capturing device 120 is capable of capturing high-quality images that enable evaluation of, for example, the existence/non-existence of icicle-like solder, the existence/non-existence of solder bridges, the surface area of the affixed solder, the gloss of the solder, and the like.

Figure 5:
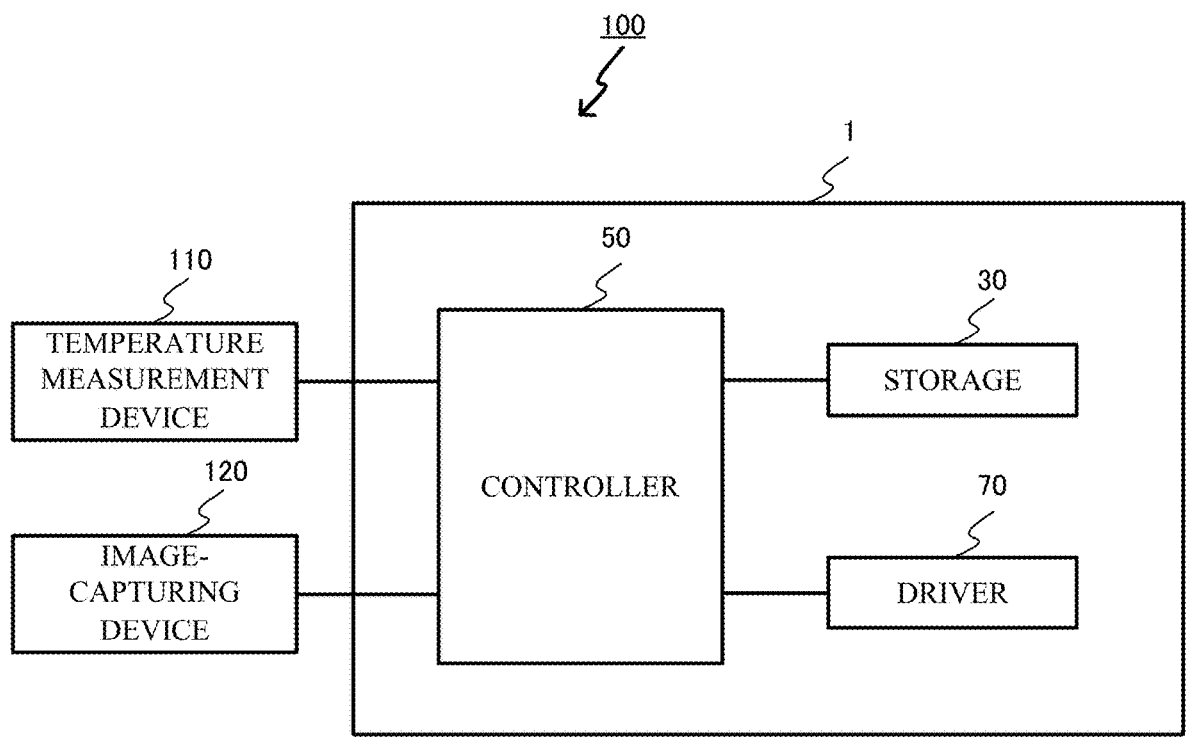
FIG. 5 is a diagram illustrating hardware of a control apparatus according to Embodiment 1.

The control apparatus 1 obtains a control parameter of the soldering system 100. The control parameter makes the temperature distribution of the surface of the substrate 200 a temperature distribution that is within an allowable range. The control apparatus 1 controls each component of the soldering system 100 based on the obtained control parameter. The control apparatus 1, as illustrated in FIG. 5, includes a storage 30, a controller 50, and a driver 70.

Figure 6:
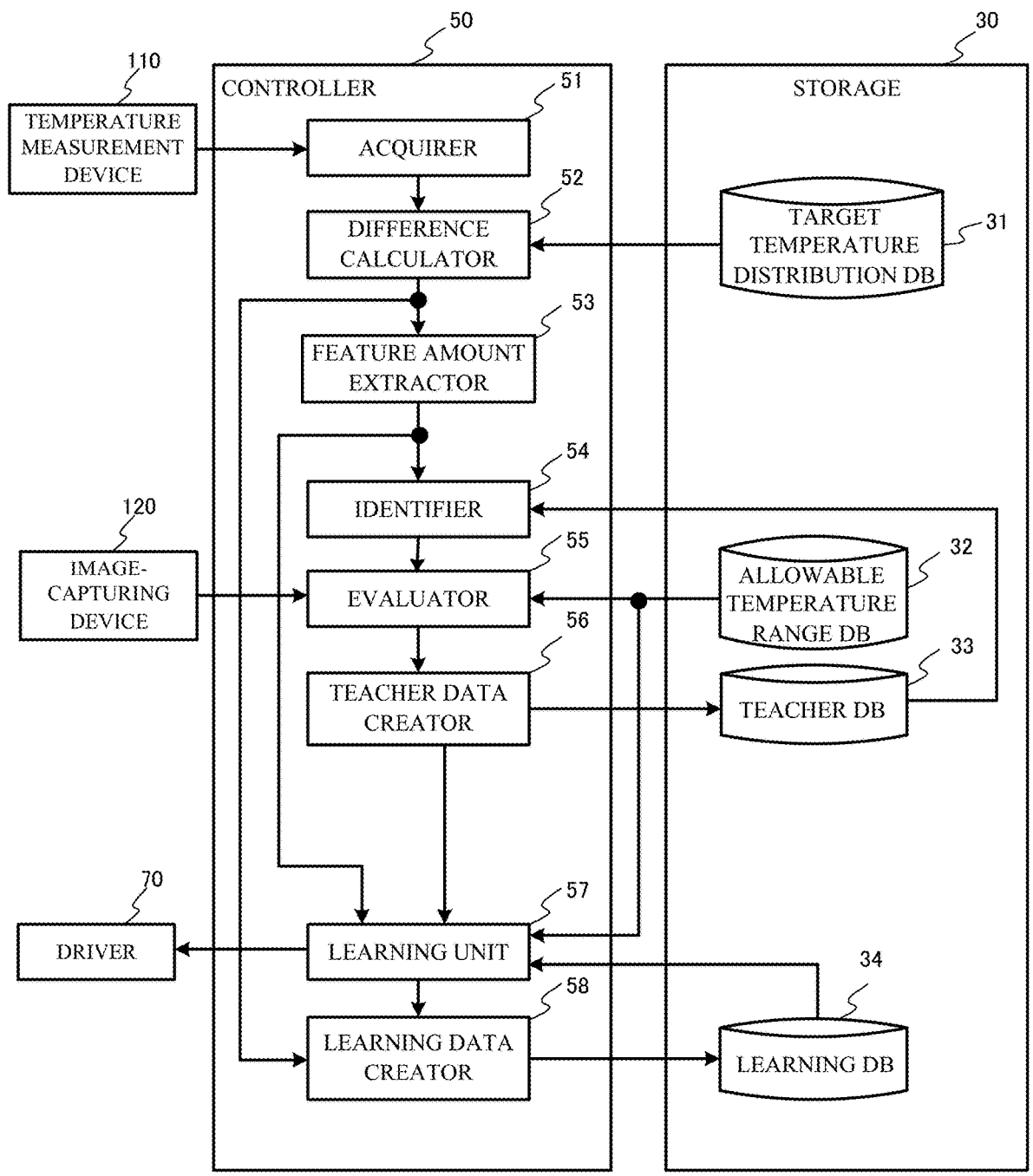
FIG. 6 is a diagram illustrating a functional configuration of the control apparatus according to Embodiment 1.

The storage 30 includes, as the hardware configuration, a read-only memory (ROM) and a random-access memory (RAM). A program that is executed by the central processing unit (CPU) of the controller 50 and data necessary to execute the program are stored in the ROM. Data created during execution of the program is stored in the RAM. As illustrated in FIG. 6, the storage 30 includes, as the functional configuration, a target temperature distribution database (DB) 31 and an allowable temperature range DB 32. The target temperature distribution DB 31 is for storing target temperature distribution data of the surface of the substrate 200. The allowable temperature range DB 32 is for storing an allowable range of a surface temperature of the substrate 200. Furthermore, the storage 30 includes a teacher DB 33 and a learning DB 34. The teacher DB 33 is for storing teacher data in which temperature distribution data of the surface of the substrate 200 is associated with an existence/non-existence of defective soldering. The learning DB 34 is for storing learning data in which a modification amount of a control parameter, temperature distribution data of the surface of the substrate 200 prior to a modifying of the control parameter, and temperature distribution data of the surface of the substrate 200 after the modifying of the control parameter are in association with one another.

The controller 50 identifies, through machine learning based on a feature amount of a temperature distribution of the surface of the substrate 200, whether or not temperature distribution of the surface of the substrate 200 is a temperature distribution that is within the allowable range. Also, when the temperature distribution of the surface of the substrate 200 is identified as being outside of the allowable range, the controller 50 obtains a control parameter of the soldering system 100 for adjusting the temperature distribution of the surface of the substrate 200 to within the allowable range.

The controller 50 includes a CPU in the hardware configuration. The controller 50 realizes functions described further below by executing the program stored in the storage 30.

The controller 50, as illustrated in FIG. 6, includes as the functional configuration, an acquirer 51, a difference calculator 52, a feature amount extractor 53, an identifier 54, an evaluator 55, a teacher data creator 56, a learning unit 57, and a learning data creator 58.

Figure 7A:
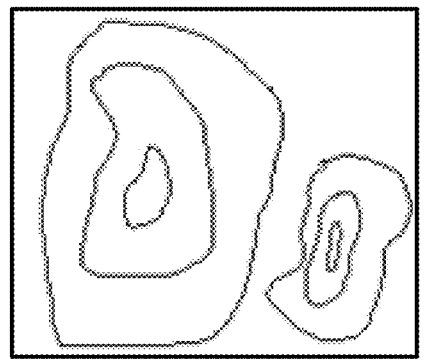
FIG. 7A is a diagram illustrating an example of a temperature distribution of a surface of a substrate.

The acquirer 51 acquires temperature information of the surface of the substrate 200 from the temperature measurement device 110. The acquirer 51, for example, divides the surface of the substrate 200 into a two-dimensional matrix having a 1,000×1,000 area. The acquirer 51 sets coordinates with respect to the matrix as 1 to 1,000 in the vertical direction and 1 to 1,000 in the horizontal direction. In performing this processing, the controller 50 can perform processing with the temperature and the coordinates of each location on the surface of the substrate 200 in association with each other. The acquirer 51 obtains a temperature for each area in the matrix based on the acquired temperature information, and creates temperature distribution data of the surface of the substrate 200. An example of temperature distribution data of the surface of the substrate 200 created by the acquirer 51 is illustrated in FIG. 7A. In FIG. 7A, the area surrounded by the outer frame represents the area of the surface of the substrate 200. The lines within the outer frame represent isotherms of the surface temperature of the substrate 200. The lines within the outer frame, for example, are isotherms plotted in 5° C. increments.

Figure 7B:
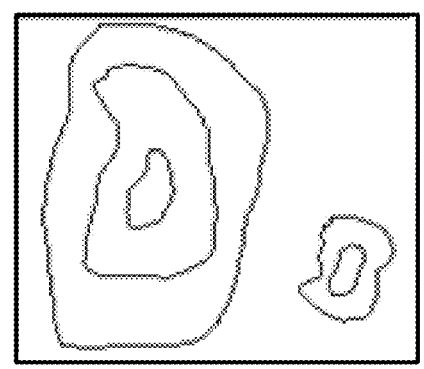
FIG. 7B is a diagram illustrating an example of a target temperature distribution data of a surface of a substrate.
Figure 7C:
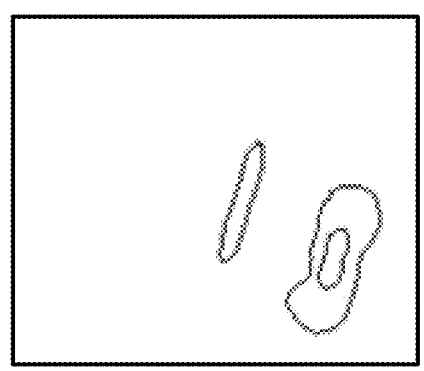
FIG. 7C is a diagram illustrating an example of distribution data of temperature difference ΔT.

Referring back to FIG. 6, the difference calculator 52 functions as difference calculation means. The difference calculator 52 compares the measured temperature distribution against a target temperature distribution of the surface of the substrate 200, and obtains a difference between the measured temperature distribution and the target temperature distribution of the surface of the substrate 200. Specifically, the difference calculator 52 obtains a difference between the temperature distribution data created by the acquirer 51 and the target temperature distribution of the surface of the substrate 200. Preferably, the temperature distribution of the surface of the substrate 200 onto which the jet solder is blown is uniform. Since the electronic component 201 is mounted on the substrate 200, the temperature distribution of the surface measured from above the substrate 200 is not uniform. Therefore, target temperature distribution data of the surface of the substrate 200 taking into account the mounted electronic component 201 is stored in advance into the target temperature distribution DB 31. FIG. 7B illustrates an example of target temperature distribution data of the surface of the substrate 200. The difference calculator 52 compares the temperature distribution data created by the acquirer 51 against the target temperature distribution data of the surface of the substrate 200 stored in the target temperature distribution DB 31, and obtains the distribution data of temperature difference $\Delta T$. Temperature difference $\Delta T$ is the difference between the temperature distribution data created by the acquirer 51 and the target temperature distribution data. An example of the obtained distribution data of temperature difference $\Delta T$ is illustrated in FIG. 7C. The target temperature distribution data of the surface of the substrate 200 is obtained in advance through experimentation. Specifically, the target temperature distribution data of the surface of the substrate 200 is created by performing statistical processing on the multiple data sets of soldering did not become defective.

The feature amount extractor 53 functions as feature amount extraction means and extracts the feature amount of measured temperature distribution data. Specifically, the feature amount extractor 53 extracts a feature amount representing distribution data of temperature difference $\Delta T$. The feature amount representing measured temperature distribution data or distribution data of temperature difference $\Delta T$ is an absolute value of temperature, a density of isotherms, a shape of isotherms, a variation in isotherms with respect to the last-measured temperature distribution of the surface of the substrate 200, a variation in isotherms with respect to a temperature distribution of the surface of the substrate 200 that is acquired prior to a set time, and the like. The set time, for example, is one hour. The feature amount representing the measured temperature distribution data or the distribution data of temperature difference $\Delta T$ is extracted by a known-technique such as principal component analysis or independent component analysis. For example, the feature amount representing the temperature distribution of temperature difference $\Delta T$ is extracted by executing a program that executes principal component analysis or independent component analysis.

The identifier 54 functions as identification means. The identifier 54 identifies whether or not the temperature distribution of the surface of the substrate 200 is a temperature distribution that is within a set allowable range. That is, the identifier 54 identifies whether a possibility of an occurrence of defective soldering in a condition of the obtained distribution data of temperature difference $\Delta T$ is high or not. The identifier 54 includes a support vector machine. Teacher data used by the support vector machine is stored in advance in the teacher DB 33. The teacher data is created by assigning a label of "defective" to temperature distribution data of soldering that became defective and assigning a label of "normal" to temperature distribution data of soldering that did not become defective. Specifically, the label of "defective" is assigned to distribution data of temperature difference $\Delta T$ of soldering that became defective, and the label of "normal" is assigned to distribution data of temperature difference $\Delta T$ of soldering that did not become defective. Identification accuracy of the identifier 54 increases as the teacher data increases.

Figure 8:
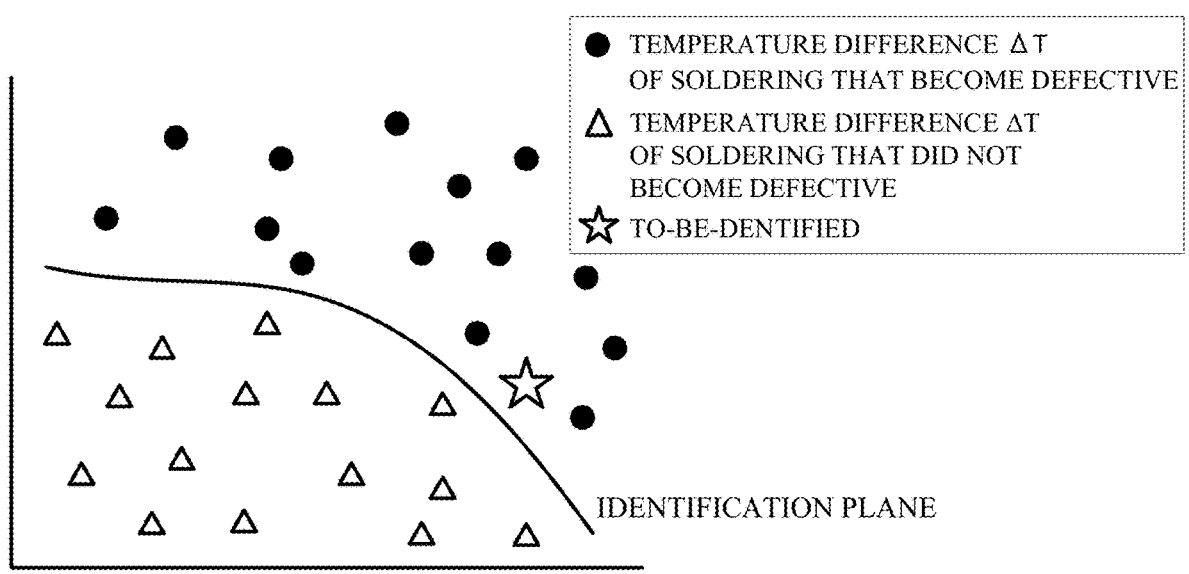
FIG. 8 is a diagram illustrating identification performed by identifier according to Embodiment 1.

Identification performed by the identifier 54 is described in detail. FIG. 8 represents a two-dimensional identification image in the support vector machine of the identifier 54. The black circle represents a feature vector of the distribution of temperature difference $\Delta T$ of soldering that became defective. The triangle marking represents a feature vector of the distribution of temperature difference $\Delta T$ of soldering that did not defective. The star marking represents a to-be-identified feature vector of the temperature distribution. Specifically, the star marking represents a to-be-identified feature vector of the distribution of temperature difference $\Delta T$. The support vector machine creates, based on the teacher data, an identification plane for identifying distribution data of temperature difference $\Delta T$ of soldering that became defective and distribution data of temperature difference $\Delta T$ of soldering that did not become defective. Then, the support vector machine of the identifier 54 identifies whether the to-be-identified distribution data of temperature difference $\Delta T$ that is represented by the star marking belongs to either the group belonging to defective soldering or the group belonging to normal. The expression "group belonging to defective soldering" means a group whose soldering became defective, and the expression "group belonging to normal" means a group whose soldering did not become defective. Also, when the to-be-identified distribution data of temperature difference $\Delta T$ belongs to the group belonging to normal, the identifier 54 identifies the temperature distribution of the surface of the substrate 200 as being within the set allowable range. When the to-be-identified distribution data of temperature difference $\Delta T$ belongs to the group belonging to defective soldering, the identifier 54 identifies the temperature distribution of the surface of the substrate 200 as being outside of the set allowable range.

The evaluator 55 functions as evaluation means. The evaluator 55 evaluates the existence/non-existence of defective soldering of the soldered substrate 200 from which distribution data of temperature difference $\Delta T$ is obtained. Specifically, the evaluator 55 is provided with image analysis functionality. The evaluator 55 analyzes a soldering state based on an image of the bottom surface of the substrate 200 captured by the image-capturing device 120. Specifically, the evaluator 55 detects the existence/non-existence of an image corresponding to icicle-like solder attached to the terminal of the electronic component 201 or the existence/non-existence of an image corresponding to solder bridges attached to the terminal of the electronic component 201. The evaluator 55 also obtains a surface area of the solder that is affixed and evaluates the excess/shortage of solder with respect to the predetermined surface area. The evaluator 55 also evaluates the gloss of the solder to evaluate whether or not the gloss satisfies a gloss criterion. The evaluator 55 evaluates multiple items as described above by performing the image analysis. The evaluator 55 evaluates the existence/non-existence of defective soldering based on the evaluation of each item.

The teacher data creator 56 functions as teacher data creation means. The existence/non-existence of defective soldering is the evaluation results of the evaluator 55. The teacher data creator 56 creates teacher data containing existence/non-existence of defective soldering and the distribution data of temperature difference $\Delta T$ in association with each other. Also, the teacher data creator 56 stores the created teacher data into the teacher DB 33. The longer the soldering system 100 is operated, the greater the accumulation of teacher data. Identification accuracy of the identifier 54 increases as the amount of accumulated teacher data increases.

Figure 9:
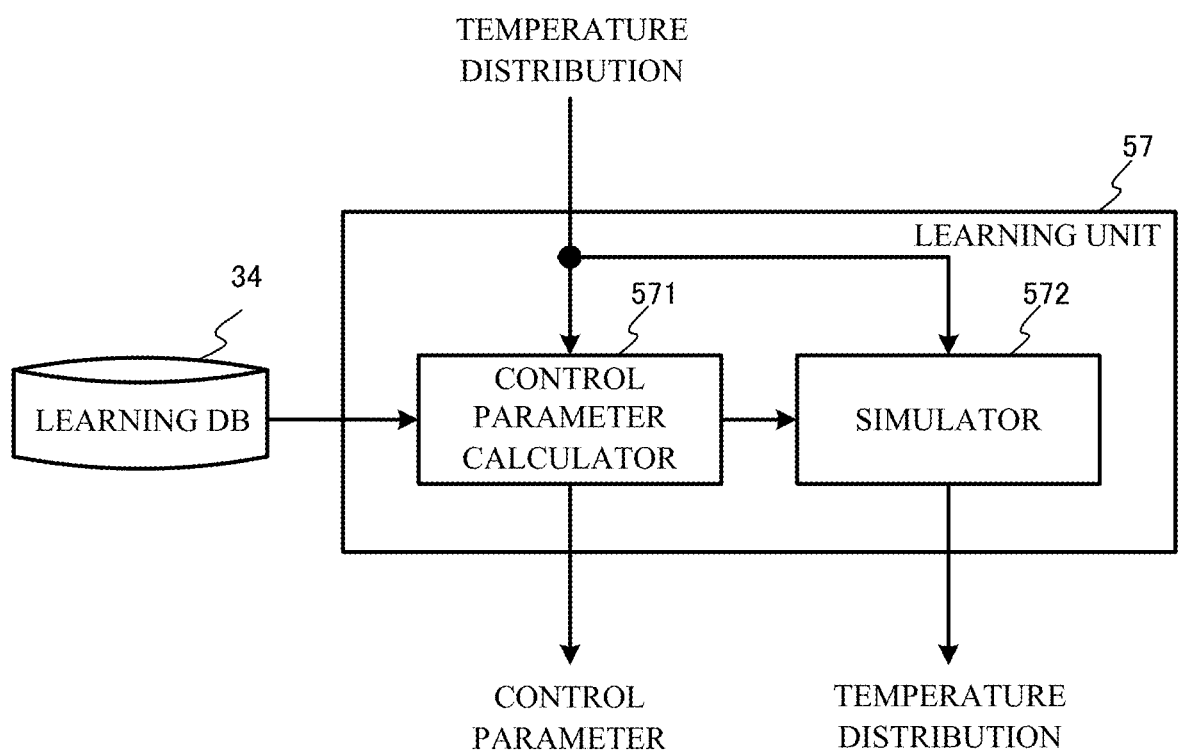
FIG. 9 is a diagram illustrating a configuration of a learning unit according to Embodiment 1.

The learning unit 57 functions as learning means. When the identifier 54 identifies the temperature distribution of the surface of the substrate 200 as being outside of the allowable range, the learning unit 57 obtains a control parameter of the soldering system 100 that places the temperature distribution of the surface of the substrate 200 within the allowable range. The learning unit 57, as illustrated in FIG. 9, includes a control parameter calculator 571. The control parameter calculator 571 has a neural network. The learning data used by the neural network is data in which the temperature distribution prior to the modifying of the control parameter, a modification amount of the control parameter, and a temperature distribution after the modifying of the control parameter are in association with one another. The learning data is obtained by experimentation. Also, the learning data is stored in advance in the learning DB 34. The control parameter calculator 571 obtains the control parameter by using the neural network based on temperature distribution data and learning data stored in the learning DB 34. For example, the control parameter calculator 571 outputs a control parameter for increasing the angle $\theta 1$ of the front former 104a by 10°, a control parameter for raising the molten solder temperature by 5° C. degrees, a control parameter for speeding up the rotational speed of the pump 106 by 20%, and the like as control parameters that make the temperature distribution of the surface of the substrate 200 a temperature distribution that is within the allowable range.

Here, the learning data is described using a detailed example. For example, learning data containing (i) any distribution data of temperature difference $\Delta T$, (ii) a variation in the number of revolutions of the pump 106, and (iii) temperature distribution data after the change in the number of revolutions of the pump 106 in association with one another is created. The variation of the number of revolutions of the pump 106 is changed and similar learning data is created. This learning data is created for different distribution data of temperature difference $\Delta T$. In addition to the number of revolutions of the pump 106, learning data is created for other modified control parameters such as the angle of the former 104, the angle of the multi-hole nozzle plate 108, the conveyance speed of the substrate conveyance belt device 102, and the temperature of the molten solder inside the solder bath 103. Through large-scale accumulation of the aforementioned learning data, information indicating what a post-modification temperature distribution will be when a particular control parameter is modified to a certain degree in response to a temperature distribution can be obtained. Therefore, the accuracy of the control parameter obtained by the neural network of the control parameter calculator 571 increases as the learning data increases.

Also, the learning unit 57 is provided with functionality for simulating a temperature distribution of the surface of the substrate 200. The learning unit 57 includes a simulator 572 that simulates the temperature distribution of the surface of the substrate 200 based on the control parameter obtained by the control parameter calculator 571. When the simulation-based temperature distribution of the surface 200 is within an allowable temperature range, the learning unit 57 outputs the control parameter obtained by the control parameter calculator 571 to the driver 70.

Referring back to FIG. 6, the learning data creator 58 functions as learning data creation means. The learning data creator 58 creates learning data in which the temperature distribution data prior to the modifying of the control parameter, the modification amount of the control parameter, and the temperature distribution data after the modifying of the control parameter are association with one another. The learning data creator 58 stores the created learning data into the learning DB 34. The temperature distribution data after the modifying of the control parameter uses distribution data of temperature difference $\Delta T$ that is created upon elapse of a set duration of time from the time the control parameter is modified. The learning data is gradually accumulated through continued operation of the soldering system 100. Accuracy of the control parameter obtained by the learning unit 57 increases as the amount of accumulated learning data increases.

The driver 70 functions as driving means. The driver 70 drives each component of the soldering system 100 based on the control parameter obtained by the learning unit 57. Specifically, the driver 70 sets the control parameter obtained by the learning unit 57 to a non-illustrated driving device that drives each of the components of the soldering system 100. Examples of the control parameter include the angle of the former 104, the angle of the multi-hole nozzle plate 108, the conveyance speed of the substrate conveyance belt device 102, the temperature of the molten solder inside the solder bath 103, and the rotational speed of the pump 106.

The soldering system 100 is driven by the newly set control parameter. In doing so, the stagnating dross is melted or stagnation location of the dross changes. Therefore, the jet solder is evenly spouted from the former 104, and thus the temperature distribution of the surface of the substrate 200 falls within the allowable temperature distribution range.

Figure 10:
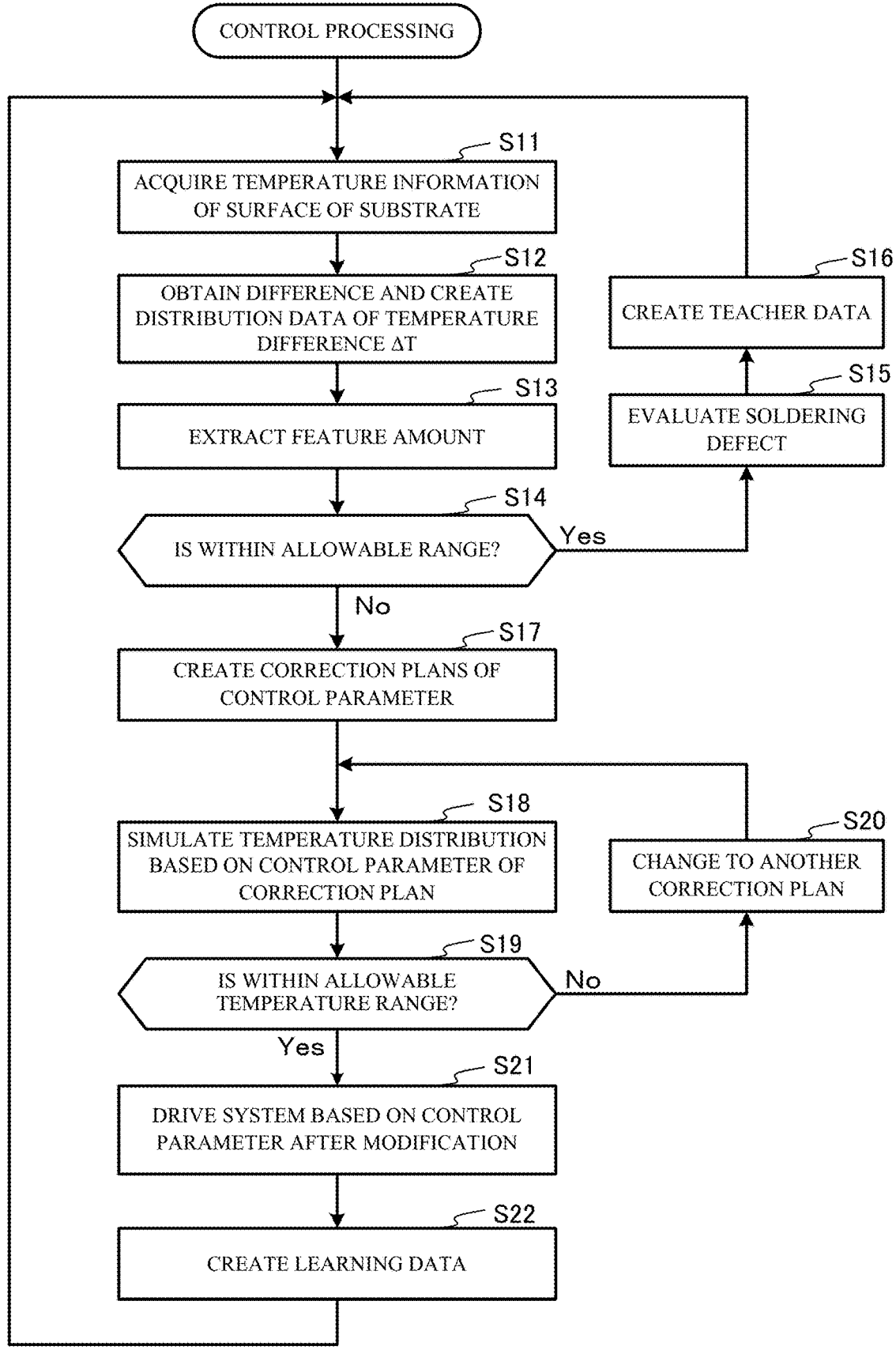
FIG. 10 is a flowchart illustrating control processing of the soldering system according to Embodiment 1.

Next, control processing is described with reference to FIG. 10. Control processing controls the control parameter of the soldering system 100 in the soldering process performed by the soldering system 100 that is provided with the aforementioned configuration. Here, the teacher data in which the temperature distribution data of the surface of the substrate 200 and an existence/non-existence of defective soldering are in association with each other is stored in advance in the teacher DB 33. Also, the learning data in which the modification amount of the control parameter, the temperature distribution data of the surface of the substrate 200 prior to the modifying of the control parameter, and the temperature distribution data of the surface of the substrate 200 after the modifying of the control parameter that are stored in association with one another is stored in the learning DB 34. Furthermore, a control parameter that serves as a criterion is set as the control parameter of the soldering system 100. When the drive switch is turned on, the soldering system 100 commences operation based on the control parameter serving as the criterion. When the soldering system 100 commences operation, first, the substrate 200 is conveyed by the substrate conveyance belt device 102 to the upper portion of the solder bath 103. Then, the temperature measurement device 110 measures a distribution of the surface temperature of the conveyed substrate 200. The temperature measurement device 110 commences the control processing illustrated in FIG. 10 once the temperature information of the surface of the substrate 200 is outputted to the control apparatus 1. The step in which the temperature measurement device 110 measures the distribution of surface temperature of the substrate 200 corresponds to a temperature measurement step.

Once the temperature information of the surface of the substrate 200 is outputted from the temperature measurement device 110, the acquirer 51 acquires the temperature information outputted by the temperature measurement device 110 (step S11). The acquirer 51 obtains, from the acquired temperature information, temperatures corresponding to each of the areas in the 1,000×1,000 matrix dividing the surface of the substrate 200, and creates temperature distribution data.

Next, the difference calculator 52 obtains a difference between the created temperature distribution data and target temperature distribution data stored in the target temperature distribution DB 31, and then creates distribution data of temperature difference $\Delta T$ (step S12).

Next, the feature amount extractor 53 extracts, from the distribution data of temperature difference $\Delta T$, a feature amount representing the distribution of temperature difference $\Delta T$ (step S13). Specifically, the feature amount extractor 53 extracts a feature amount of, for example, an absolute value of temperature, a density of isotherms, a shape of isotherms, and a variation in isotherms with respect to the isotherms in the last-measured temperature distribution.

Next, the identifier 54 identifies, through machine learning based on teacher data stored in the teacher DB 33 and a feature amount of a distribution of temperature difference $\Delta T$, whether the to-be-identified distribution data of temperature difference $\Delta T$ belongs to either the group belonging to defective soldering or the group belonging to normal. That is, the identifier 54 identifies whether or not the temperature distribution of the surface of the substrate 200 is a temperature distribution that is within an allowable range (step S14). This step corresponds to an identification step.

In a case in which the identifier 54 identifies the distribution of temperature difference $\Delta T$ as being a temperature distribution that is within the allowable range (YES in step S14), the evaluator 55 evaluates the existence/non-existence of defective soldering in the substrate 200 on which soldering was performed based on a current control parameter (step S15). Specifically, the evaluator 55 analyzes a captured image indicating the state of soldering of the substrate 200. The state of soldering of the substrate 200 is captured by the image-capturing device 120. Then the evaluator 55 evaluates the existence/non-existence of icicle-like solder attached to a terminal of the electronic component 201, the existence/non-existence of solder bridges attached to a terminal of the electronic component 201, the surface area of the affixed solder, the gloss of the solder, and the like. Furthermore, the teacher data creator 56 creates teacher data in which the evaluation result of the evaluator 55 and the distribution data of temperature difference $\Delta T$ are in association with each other, and then stores the created teacher data into the teacher DB 33 (step S16). The longer the soldering system 100 is operated, the greater the accumulation of teacher data. Identification accuracy of the identifier 54 increases as the amount of accumulated teacher data increases.

Conversely, in a case in which the identifier 54 identifies the distribution of temperature difference ΔT as being a temperature distribution that is outside of the allowable range (NO in step S14), the learning unit 57 creates multiple corrections plans for the control parameter of the soldering system 100, the correction plans being for making the temperature distribution of the surface of the substrate 200 a temperature distribution that is within the allowable range (step S17). Specifically, the learning unit 57 obtains a control parameter by using the neural network of the control parameter calculator 571 based temperature distribution data and learning data stored in the learning DB 34. The control parameter calculator 571 obtains multiple candidates of combinations of control parameters.

Next, the simulator 572 of the learning unit 57 simulates the temperature distribution of the surface of substrate 200 based on the control parameter of the correction plan obtained by the control parameter calculator 571 (step S18).

The simulator 572 compares the simulation result against the allowable temperature range stored in the allowable temperature range DB 32, and determines whether or not the simulation-based temperature distribution of the surface of the substrate 200 is within the allowable temperature range (step S19). Specifically, the simulator 572 determines whether or not the temperature for each area in the 1,000× 1,000 matrix obtained through a simulation, is within the allowable temperature range. In a case in which the simulation-based temperature distribution of the surface of the substrate 200 is determined as being outside of the allowable temperature range (NO in step S19), the simulator 572 changes to another correction plan of the control parameter (step S20), and repeats steps S18 to S20. The process of steps S17 to S20 corresponds to a learning step.

Conversely, in a case in which the simulation-based temperature distribution of the surface of the substrate 200 is determined as being within the allowable temperature range (YES in step S19), the learning unit 57 outputs the control parameter that will make the temperature distribution of the surface of the substrate 200 a temperature distribution that is within the allowable temperature range, as a post-modification control parameter, to the driver 70. The driver 70 drives the soldering system 100 based on the post-modification control parameter (step S21).

Next, the learning data creator 58 creates learning data in which the temperature distribution data prior to the modifying of the control parameter, the modification amount of the control parameter, and the temperature distribution data after the modifying of the control parameter are in association with one another, and then stores the created learning data into the learning DB 34 (step S22). The longer the soldering system 100 is operated, the greater the accumulation of learning data. Accuracy of the control parameter obtained by the learning unit 57 increases as the amount of accumulated learning data increases.

Each time the substrate 200 is conveyed to the upper portion of the solder bath 103, the soldering system 100 repeats processing of steps S11 to S22. Control processing ends when the drive switch of the soldering system 100 is turned off.

A preheater may be provided on the aforementioned substrate conveyance belt device 102. In doing so, the surface temperature of the substrate 200 that is conveyed to the solder bath 103 can be maintained at a constant level, thereby reducing the occurrence rate of defective soldering. Also, the temperature of the preheater may be included in a control parameter.

Also, the aforementioned multi-hole nozzle plate 108 has round holes. The shape of the holes provided through multi-hole nozzle plate 108 may alternatively be square, triangular, elliptic, and the like. The multi-hole nozzle plate 108 may also be changed to a nozzle formed by multiple hoses. Also, the inclusion of the multi-hole nozzle plate 108 is optional.

Also, although the control parameter of the former 104 is described as an angle of θ1 to θ5, the control parameter of the former 104 is not limited to this example. For example, the location of the former 104 in the solder bath 103 may be included in a control parameter. Furthermore, the set time period is not limited to one hour. Examples of the set time period include one minute, and twenty-four hours.

Also, the aforementioned evaluator 55 is provided with image analysis functionality, and analyzes a captured image to evaluate the existence/non-existence of defective soldering. The act of evaluating the existence/non-existence of defective soldering may be performed by a worker. The teacher data creator 56 creates teacher data in which the temperature distribution data and the existence/non-existence of defective soldering are in association with each other. Therefore, the worker may create teacher data in which the temperature distribution data and the existence/non-existence of defective soldering are in association with each other, and the evaluator 55 may acquire the teacher data created by the worker.

Also, in a case in which the accumulated teacher data is low, the worker may perform the processing performed by the identifier 54.

Also, the aforementioned simulator 572 compares the simulation result against the allowable temperature range stored in the allowable temperature range DB 32, and determines whether or not, in the simulation, the temperature distribution of the surface of the substrate 200 is within the allowable temperature range. The determination method of the simulation result is not limited to this. For example, the temperature distribution obtained through the simulation may be inputted into the support vector machine and may be identified as belonging to either the group belonging defective soldering or the group belonging to normal.

Also, the aforementioned learning unit 57 is provided with the simulator 572, and after the appropriateness of the control parameter obtained by the control parameter calculator 571 is confirmed, the learning unit 57 outputs the obtained control parameter to the driver 70. The learning unit 57 may be provided without the simulator 572. For example, in a case in which a sufficient amount of learning data is provided as initial data, the learning unit 57 may be provided without the simulator 572. Also, in a case in which a lot of learning data is accumulated and the accuracy of the control parameter obtained by the control parameter calculator 571 reaches a high level, the simulator 572 may be stopped from functioning. By stopping the simulator 572 from functioning, the burden of processing in the control apparatus 1 can be reduced.

Also, the aforementioned acquirer 51 divides the surface of the substrate 200 into a two-dimensional matrix having a 1,000×1,000 area. The dividing of the surface of the substrate 200 is not limited to this example. The acquirer 51 may divide the surface of the substrate 200 in accordance with the size of the substrate 200, the analysis accuracy of the temperature distribution, the control accuracy of the soldering system 100, and the like. For example, the acquirer 51 may divide the surface of the substrate 200 into, for example, a 50×50 area, a 100×800 area, or a 7000×3000 area.

Embodiment 2

In Embodiment 1, an identification is made as to whether the temperature distribution of the surface of the to-be-identified substrate 200 is a temperature distribution that is within or outside of the allowable range based on the difference between the measured temperature distribution data of the surface of the substrate 200 and the target temperature distribution data of the surface of the substrate 200. The method for identifying whether or not the to-be-identified temperature distribution of the surface of the substrate 200 is a temperature distribution that is within the allowable range is not limited to this example. Embodiment 2 describes, with reference to FIG. 11, a method for identifying whether or not a to-be-identified temperature distribution of the surface of the substrate 200 is a temperature distribution that is within the allowable range, without obtaining the difference between the measured temperature distribution data of the surface of the substrate 200 and the set target temperature distribution data of the surface of the substrate 200.

Figure 11:
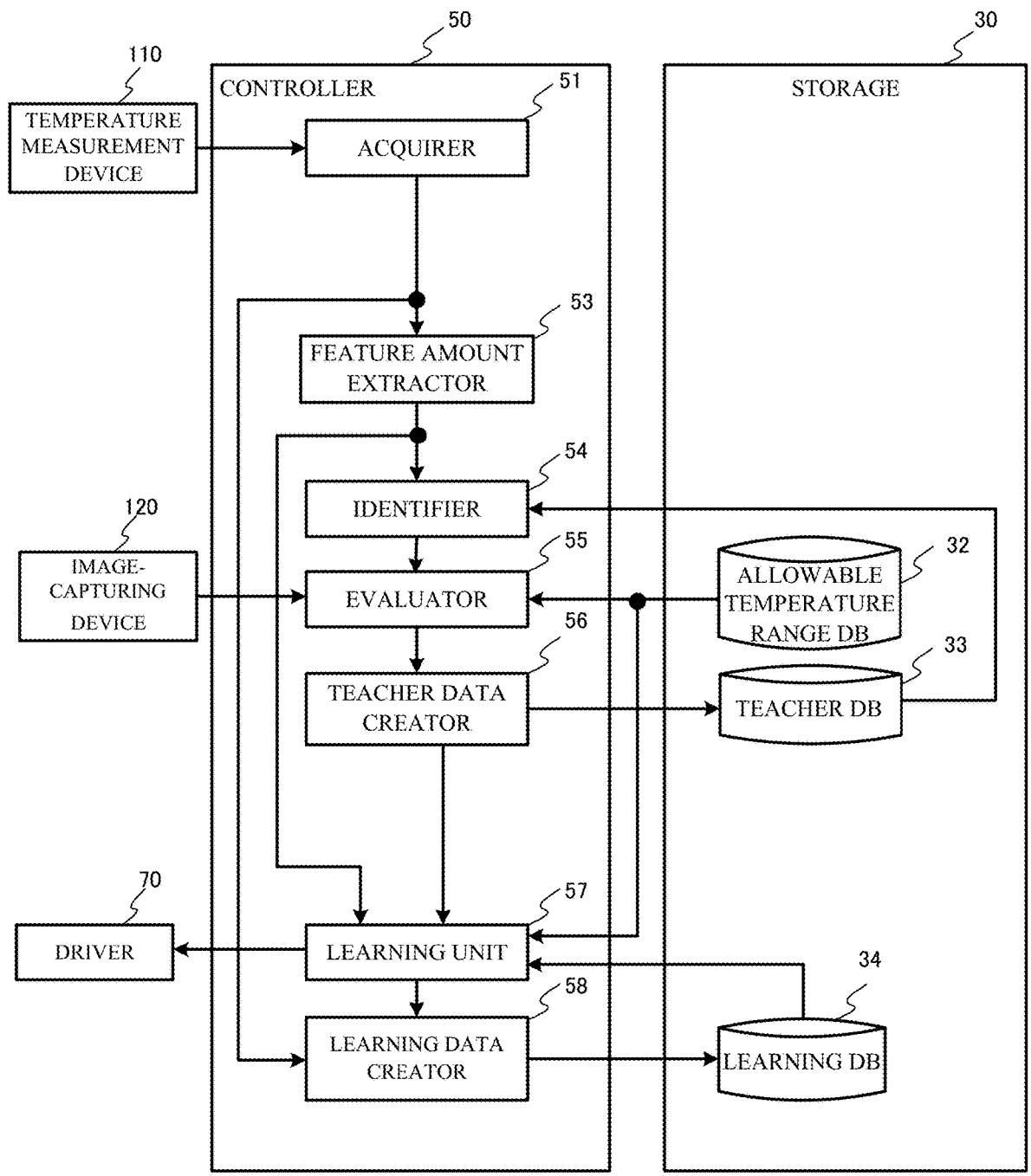
FIG. 11 is a diagram illustrating a functional configuration of a control apparatus according to Embodiment 2.

The controller 50 of the soldering system 100 according to Embodiment 2, as illustrated in FIG. 11, does not include the difference calculator 52. Also, the storage 30 does not include the target temperature distribution DB 31.

The acquirer 51 acquires temperature information of the surface of the substrate 200 from the temperature measurement device 110. The acquirer 51 obtains temperatures corresponding to each of the areas in the 1,000×1,000 matrix dividing the surface of the substrate 200, and creates measured temperature distribution data.

The feature amount extractor 53 extracts a feature amount representing a feature of the temperature distribution from the temperature distribution data created by the acquirer 51. Specifically, the feature amount extractor 53 extracts a feature amount of, for example, an absolute value of temperature, a density of isotherms, a shape of isotherms, and a variation in isotherms with respect to the last-measured temperature distribution.

The identifier 54 identifies, through machine learning based on the feature amount of the temperature distribution extracted by the feature amount extractor 53, whether or not the temperature distribution of the surface of the substrate 200 is a temperature distribution that is within the allowable range. Specifically, the identifier 54 includes the support vector machine. The teacher data that is used by the support vector machine is stored in advance in the teacher DB 33. The teacher data is created by assigning a label of "defective" to temperature distribution data of soldering that became defective and assigning a label of "normal" to temperature distribution data of soldering that did not become defective.

The evaluator 55 evaluates the existence/non-existence of defective soldering of the soldered substrate 200 from which a feature amount is extracted. Then, the teacher data creator 56 creates teacher data in which the evaluation result of the evaluator 55 and the temperature distribution data are in association with each other. Furthermore, the teacher data creator 56 stores the created teacher data into the teacher DB 33. All other components of the configuration are the same as those in Embodiment 1.

The soldering system 100 according to Embodiment 2 as described above can directly identify whether or not the temperature distribution of the surface of the substrate 200 is a temperature distribution that is within the allowable range based on the temperature distribution data of the surface of the substrate 200, without obtaining distribution data of temperature difference $\Delta T$.

Embodiment 3

In Embodiments 1 and 2, the identifier 54 includes the support vector machine. The identifier 54 may be of a different configuration. In Embodiment 3, an identifier 54 that does not include the support vector machine is described with reference to FIG. 12.

Figure 12:
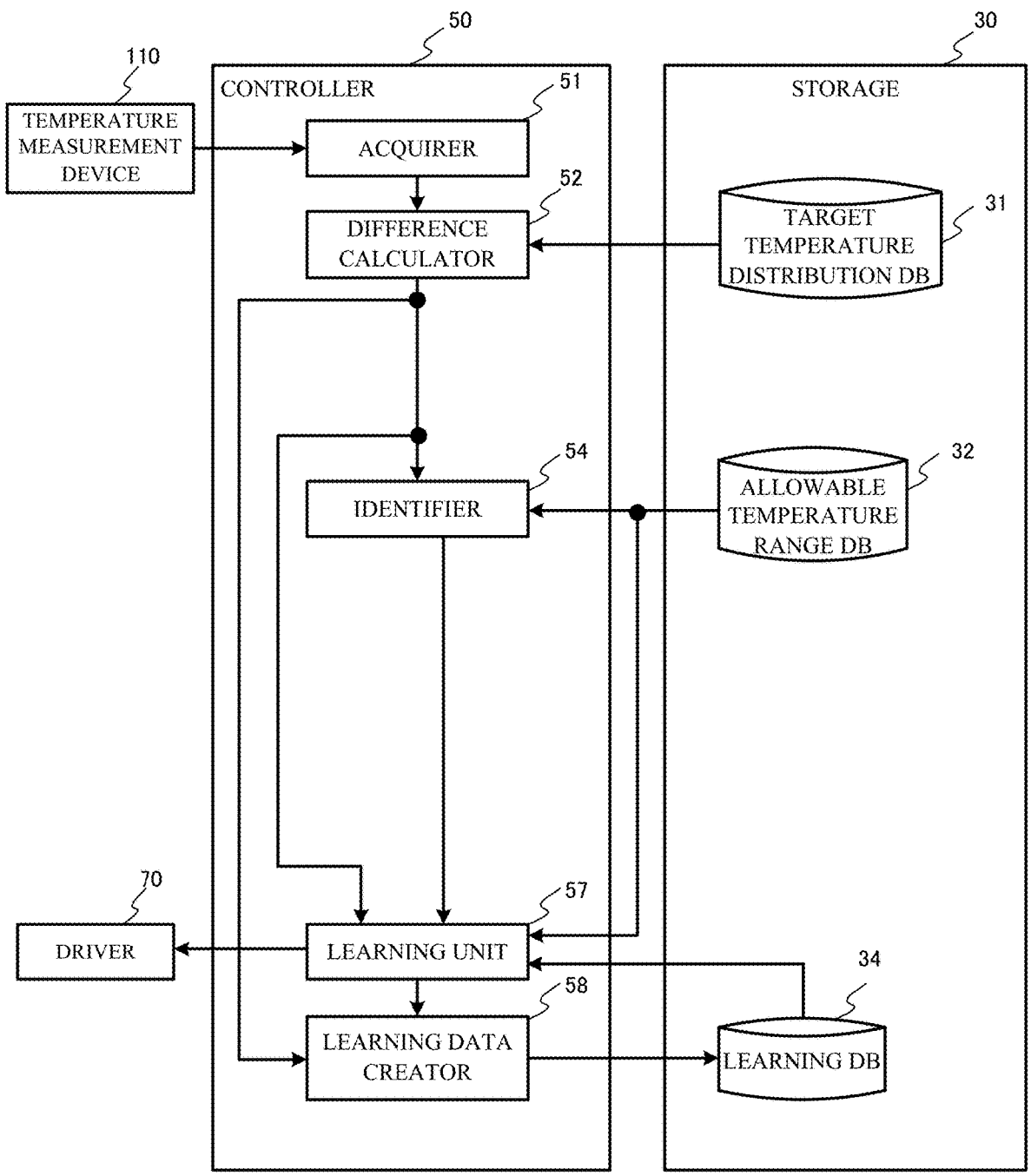
FIG. 12 is a diagram illustrating a functional configuration of a control apparatus according to Embodiment 3.

The controller 50 of the soldering system 100 according to Embodiment 3, as illustrated in FIG. 12, does not include the feature amount extractor 53 and the teacher data creator 56. Also, the storage 30 does not include the teacher DB 33.

The acquirer 51 acquires temperature information of the surface of the substrate 200 from the temperature measurement device 110. The acquirer 51 obtains temperatures corresponding to each of the areas in the 1,000×1,000 matrix dividing the surface of the substrate 200, and creates measured temperature distribution data.

The difference calculator 52 compares the temperature distribution data created by the acquirer 51 against the target temperature distribution data that is stored in the target temperature distribution DB 31, and obtains temperature difference $\Delta T$ for each area. The difference calculator 52 creates distribution data of temperature difference $\Delta T$ based on obtained temperature difference $\Delta T$.

The identifier 54 identifies whether or not temperature difference $\Delta T$ obtained by the difference calculator 52 is within a range of allowable temperatures stored in the allowable temperature range DB 32. Specifically, the identifier 54, with the use of subtractive processing, identifies whether or not temperature difference $\Delta T$ that exceeds the allowable temperature range exists in the distribution data of temperature difference $\Delta T$. Then, in a case in which temperature difference $\Delta T$ that exceeds the allowable temperature range exists in the distribution data of temperature difference $\Delta T$, the learning unit 57 obtains a control parameter of the soldering system 100 that makes the temperature distribution of the surface of the substrate 200 a temperature distribution that is within the allowable range.

An example is described for identifying whether or not temperature difference $\Delta T$ is within an allowable range, where the allowable temperature range is ±10° C. The identifier 54 obtains a difference between a target temperature stored in the target temperature distribution DB 31 and a measured temperature, for each of the areas in the 1000×1,000 area. Then, if there is an area where the obtained difference exceeds the ±10° C. that is stored in the allowable temperature range DB 32, the identifier 54 identifies that there is a temperature difference $\Delta T$ that exceeds the allowable temperature range.

The learning unit 57 is the same as that in Embodiment 1.

The aforementioned identifier 54 obtains the difference between the target temperature and the measured temperature and then identifies whether or not the obtained difference in temperature is within the range of allowable temperatures, and this process is repeated for each area in the 1,000×1,000 matrix. The identification in the identifier 54 is not limited to this example. For example, the temperature information of the allowable range for each area in the 1,000×1,000 matrix may be stored in the target temperature distribution DB 31, and the identifier 54 may identifier whether or not the measured temperature is within the allowable temperature range based on the temperature information of the stored allowable temperature range. For example, in a case in which the temperature information of an allowable temperature range of a particular area stored in the target temperature distribution DB 31 is represented as no less than 270° C. and no greater than 290° C., and the measured temperature in the particular area is 265° C., the identifier 54 identifies the measured temperature as being outside of the allowable temperature range.

In Embodiments 1 to 3, the learning unit 57 includes a neural network but the configuration of the learning unit 57 is not limited to these examples. For example, the learning unit 57 may obtain the control parameter that makes the temperature distribution of the surface of the substrate 200 a temperature distribution that is within the allowable range by multiple regression analysis instead of the neural network. Specifically, the learning unit 57 constructs an approximation expression representing the temperature distribution of the surface of the substrate 200, where multiple control parameters are set as variables. Then, the learning unit 57 modifies the modification amount of a particular control parameter, and then simulates a temperature distribution of the surface of the substrate 200, based on the post-modification control parameter. The learning unit 57 changes to another control parameter, and repeats simulations. Furthermore, the learning unit 57 selects multiple control parameters that are to be modified and repeats simulations while changing the control combinations.

In such a case, the combination of control parameters in the simulations and the number of combinations of control parameter values is massive. Therefore, a table containing a list prioritized simulation conditions candidates corresponding to the location of the areas, the difference between the measured temperature and the allowable temperature range, and the like is stored in the storage 30. The simulation conditions and priority ranking are obtainable through experimentation. Then the learning unit 57 repeats simulations while changing the simulation conditions based on the priority ranking in the table stored in the storage 30 and obtains a control parameter that makes the temperature distribution of the surface of the substrate 200 a temperature distribution that is within the allowable range. Furthermore, the learning unit 57 outputs the obtained control parameter to the driver 70.

As described above, the soldering system 100 includes the identifier 54 that identifies whether or not the temperature distribution of the surface of the substrate 200 is a temperature distribution that is within the allowable range. In doing so, the soldering system 100 can identify, based on the to-be-identified temperature distribution that is measured, whether or not there is a possibility of occurrence of defective soldering. Also, the soldering system 100 includes the learning unit 57 that obtains the control parameter of the soldering system 100 that makes the temperature distribution of the surface of the substrate 200 a temperature distribution that is within the allowable range. In doing so, the soldering system 100 can automatically adjust the control parameter.

Also, the soldering system 100 includes the difference calculator 52 that compares the measured temperature distribution against the target temperature distribution, and obtains the difference between the measured temperature distribution and the target temperature distribution. In doing so, the soldering system 100 can identify, through machine learning based on the difference between the target temperature distribution and the temperature distribution of the surface of the substrate 200, whether or not the temperature distribution of the surface of the substrate 200 is a temperature distribution that is within the allowable range.

The soldering system 100 includes the temperature measurement device 110 that uses an infrared camera capturing an image of the surface of the substrate 200 that passes over the upper portion of the solder bath 103. In doing so, the soldering system 100 can measure the temperature distribution of the surface of the substrate 200 as a thermal image pattern.

The temperature measurement device 110 takes an image of the surface of the substrate 200 with the infrared camera via the reflective mirror 111 that is an aluminum vapor deposited infrared mirror, and then measures the temperature distribution of the surface of the substrate 200. In doing so, damage to the costly infrared camera that is caused by soldering steam can be prevented.

The soldering system 100 includes the evaluator 55 that evaluates the existence/non-existence of defective soldering of the soldered substrate 200 and the teacher data creator 56 that creates teacher data in which the temperature distribution of the surface of the substrate 200 and the existence/non-existence of defective soldering that is the evaluation result of the evaluator 55 are in association with each other. In doing so, the soldering system 100 can ensure higher identification accuracy of the identifier 54 as the amount of accumulated teacher data increases.

The soldering system 100 includes the learning data creator 58 that creates teacher data in which the temperature distribution prior to the modifying of the control parameter, the modification amount of the control parameter, and the temperature distribution after the modifying of the control parameter are in association with one another. In doing so, the soldering system 100 can ensure higher accuracy of the control parameter that is obtained by the learning unit 57 as the amount of accumulated learning data increases.

The individual functions of the control apparatus 1 of the soldering system 100 according to the embodiments of the present disclosure can also be implemented by a general-purpose computer. Specifically, in the foregoing embodiments, the program implemented by the control apparatus 1 is stored in the ROM of the storage 30. Also, the program may be stored in a non-transitory computer-readable recording medium such as a flexible disk, a compact disc read-only memory (CD-ROM), a digital versatile disc (DVD), magneto-optical disc (MO) or the like and distributed, and then by reading the program in to the computer, the program may be installed onto a computer to provide the computer with the ability to achieve the aforementioned individual functions.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2017-014508, filed on Jan. 30, 2017, the entire disclosure of which is incorporated by reference herein.

REFERENCE SIGNS LIST

1 Control apparatus
30 Storage

31 Target temperature distribution DB
32 Allowable temperature range DB
33 Teacher DB
34 Learning DB
50 Controller
51 Acquirer
52 Difference calculator
53 Feature amount extractor
54 Identifier
55 Evaluator
56 Teacher data creator
57 Learning unit
571 Control parameter calculator
572 Simulator
58 Learning data creator
70 Driver
100 Soldering system
102 Substrate conveyance belt device
103 Solder bath
104 Former
104a Front former
104b Rear former
104c Nozzle wall
104d Extended wall
104e Nozzle wall
104f Extended wall
105 Nozzle
106 Pump
107 Solder guide plate
108 Multi-hole nozzle plate
110 Temperature measurement device
111 Reflective mirror
120 Image-capturing device
200 Substrate
201 Electronic component

The invention claimed is:

1. A soldering system for jetting molten solder stored inside a solder bath to solder a solder workpiece, the soldering system comprising:
a temperature measurer to measure a temperature distribution of a surface of the solder workpiece;
a difference calculator to calculate the temperature distribution measured by the temperature measurer against a target temperature distribution and obtain a difference between the measured temperature distribution and the target temperature distribution;
an identifier to identify whether or not the temperature distribution of the surface of the solder workpiece is a temperature distribution that is within a set allowable range;
a learning unit to obtain a control parameter when the identifier identifies the temperature distribution of the surface of the solder workpiece as being outside of the allowable range, the control parameter making the temperature distribution of the surface of the solder workpiece a temperature distribution that is within the allowable range; and
a driver to drive the soldering system based on the control parameter obtained by the learning unit,
wherein the identifier identifies, through machine learning based on the difference, whether or not the temperature distribution of the surface of the solder workpiece is a temperature distribution that is within the allowable range.

2. The soldering system according to claim 1, further comprising:
a feature amount extractor to extract a feature amount of the measured temperature distribution,
wherein the identifier identifies whether or not the temperature distribution of the surface of the solder workpiece is a temperature distribution that is within the allowable range through machine learning based on (i) teacher data in which a feature amount of a temperature distribution of the surface of the solder workpiece that became soldering defective is assigned a label of defective and a feature amount of a temperature distribution of the surface of the solder workpiece that did not become soldering defective is assigned a label of normal and (ii) the feature amount of the measured temperature distribution.

3. The soldering system according to claim 1, further comprising:
an evaluator to evaluate an existence or a non-existence of defective soldering in the solder workpiece that is soldered based on the control parameter; and
a teacher data creator to create teacher data in which the measured temperature distribution and the existence or the non-existence of defective soldering evaluated by the evaluator are in association with each other.

4. The soldering system according to claim 1, wherein the learning unit uses a neural network to obtain the control parameter that makes the temperature distribution of the surface of the solder workpiece a temperature distribution that is within the allowable range.

5. The soldering system according to claim 4, further comprising,
a learning data creator to create learning data in which a temperature distribution of the surface of the solder workpiece prior to a modifying of the control parameter, a modification amount of the control parameter, and a temperature distribution of the surface of the solder workpiece after the modifying of the control parameter are in association with one another,
wherein the learning unit obtains, based on the learning data, the control parameter that makes the temperature distribution of the surface of the solder workpiece a temperature distribution that is within the allowable range.

6. The soldering system according to claim 1, wherein the temperature measurer captures an image of the surface of the solder workpiece by an infrared camera and measures the temperature distribution of the surface of the solder workpiece.

7. The soldering system according to claim 6, wherein the infrared camera captures an image of the surface of the solder workpiece via an aluminum vapor deposited infrared reflective mirror.

8. The soldering system according to claim 1, wherein the control parameter includes at least one of a temperature of the molten solder, a jet flow amount of the molten solder, a jet flow location of the molten solder, or a jet flow angle of the molten solder.

9. A control apparatus comprising:
a difference calculator to
calculate a temperature distribution of a surface of a solder workpiece against a target temperature distribution, the temperature distribution of the surface of the solder workpiece being acquired from a temperature measurer that measures the temperature distribution of the surface of the solder workpiece, and obtain a difference between the acquired temperature distribution and the target temperature distribution;

an identifier to identify whether or not the acquired temperature distribution is a temperature distribution that is within a set allowable range;

a learning unit to obtain a control parameter of a soldering system when the identifier identifies the temperature distribution of the surface of the solder workpiece as being outside of the allowable range, the control parameter making the temperature distribution of the surface of the solder workpiece a temperature distribution that is within the allowable range; and a driver to drive the soldering system based on the control parameter of the soldering system obtained by the learning unit, wherein the identifier identifies, through machine learning based on the difference, whether or not the temperature distribution of the surface of the solder workpiece is a temperature distribution that is within the allowable range.

10. A control method of a soldering system for jetting molten solder stored in a solder bath to solder a solder workpiece, the control method comprising:

measuring a temperature distribution of a surface of the solder workpiece;

calculating the measured temperature distribution of the surface of the solder workpiece against a target temperature distribution, and obtaining a difference between the measured temperature distribution and the target temperature distribution;

identifying whether or not the temperature distribution of the surface of the solder workpiece is a temperature distribution that is within a set allowable range; and obtaining a control parameter of the soldering system when the temperature distribution of the surface of the solder workpiece is identified as being outside of the allowable range, the control parameter making the temperature distribution of the surface of the solder workpiece a temperature distribution that is within the allowable range, wherein the identifying includes identifying, through machine learning based on the difference, whether or not the temperature distribution of the surface of the solder workpiece is a temperature distribution that is within the allowable range.

11. A non-transitory computer-readable recording medium storing a program, the program causing a computer to function as:

a temperature measurer to measure a temperature distribution of a surface of a solder workpiece;

a difference calculator to calculate the temperature distribution measured by the temperature measurer against a target temperature distribution, and obtain a difference between the measured temperature distribution and the target temperature distribution;

an identifier to identify whether or not the temperature distribution of the surface of the solder workpiece is a temperature distribution that is within a set allowable range; and a learning unit to obtain a control parameter of a soldering system when the identifier identifies the temperature distribution of the surface of the solder workpiece as being outside of the allowable range, the control parameter making the temperature distribution of the surface of the solder workpiece a temperature distribution that is within the allowable range, wherein the identifier identifies, through machine learning based on the difference, whether or not the temperature distribution of the surface of the solder workpiece is a temperature distribution that is within the allowable range.

12. A soldering system for jetting molten solder stored inside a solder bath to solder a solder workpiece, the soldering system comprising:

a learning unit to obtain, based on a temperature distribution of a surface of the solder workpiece that is measured through reflection by an infrared reflective mirror of infrared rays emitted from the solder workpiece, a control parameter that makes the temperature distribution of the surface of the solder workpiece a temperature distribution that is within a set allowable range; and a driver to drive the soldering system based on the control parameter obtained by the learning unit.

13. The soldering system according to claim 12, further comprising an identifier to identify whether or not the temperature distribution of the surface of the solder workpiece is a temperature distribution that is within the allowable range.

* * * * *